(12) United States Patent
Waldmeier (10) Patent No.: US 11,552,603 B2
(45) Date of Patent: Jan. 10, 2023

(54) AMPLIFIER CIRCUIT AND METHOD FOR OPERATING AN AMPLIFIER CIRCUIT

(71) Applicant: Siemens Schweiz AG, Zürich (CH)

(72) Inventor: Christoph Waldmeier, Siebenen (CH)

(73) Assignee: SIEMENS SCHWEIZ AG, Zurich (CH)

( * ) Notice: Subject to any disclaimer, the term of this patent is extended or adjusted under 35 U.S.C. 154(b) by 828 days.

(21) Appl. No.: 16/349,453

(22) PCT Filed: Oct. 26, 2017

(86) PCT No.: PCT/EP2017/077453
§ 371 (c)(1),
(2) Date: Apr. 6, 2020

(87) PCT Pub. No.: WO2018/086899
PCT Pub. Date: May 17, 2018

(65) Prior Publication Data
US 2021/0013848 A1    Jan. 14, 2021

(30) Foreign Application Priority Data
Nov. 14, 2016  (EP) ..................................... 16198640

(51) Int. Cl.
*H03F 3/21*     (2006.01)
*H03F 3/217*    (2006.01)
(Continued)

(52) U.S. Cl.
CPC ...... *H03F 3/2171* (2013.01); *H02M 3/33584* (2013.01); *H04B 14/026* (2013.01)

(58) Field of Classification Search
CPC ......... H03F 3/2171; H03F 2203/21161; H03F 3/2173; H02M 3/33584; H02M 3/33592;
(Continued)

(56) References Cited

U.S. PATENT DOCUMENTS

| 8,767,867 | B1 * | 7/2014 | Castor-Perry | ............ H03C 3/00 |
| | | | | 375/295 |
| 10,298,292 | B2 * | 5/2019 | Choi | ..................... H05B 47/185 |

(Continued)

FOREIGN PATENT DOCUMENTS

| EP | 2 993 800 | A1 |   | 3/2016 | ............ H02M 3/158 |
| EP | 3101807 | A1 | * | 12/2016 | |

(Continued)

OTHER PUBLICATIONS

International Search Report and Written Opinion, Application No. PCT/EP2017/077453, 21 pages, dated Jan. 2, 2018.

*Primary Examiner* — S M Sohel Imtiaz
(74) *Attorney, Agent, or Firm* — Slayden Grubert Beard PLLC (57) ABSTRACT

An amplifier circuit acting as a line driver in a line between a central station and field devices connected thereto comprising: a DC/DC converter integrated in the circuit as a power stage comprising a DC/pulse converter with two electrically isolated switching stages; a logic block preceding the converter, generating control signals for the switches from a PWM signal and feeding them into the converter in an electrically isolated manner using drivers; a priority block generating the PWM signal; a first and a second controller. The priority block forwards output from the first or second controller. The first controller generates a fault signal based on a voltage limit and an output voltage fed back within the amplifier circuit via a feedback path. The second controller generates a fault signal based on a current limit and the output current. The central station defines the current limit and the voltage limit.

7 Claims, 6 Drawing Sheets

(51) Int. Cl.
    *H02M 3/335*    (2006.01)
    *H04B 14/02*    (2006.01)
(58) Field of Classification Search
    CPC .......... H04B 14/026; H04B 2203/5458; H04B
        3/542; H04B 3/548; Y02B 70/10; H04L
        12/10
    See application file for complete search history.

(56) References Cited

U.S. PATENT DOCUMENTS

| | | | |
|---|---|---|---|
| 2006/0022851 A1* | 2/2006 | Leung .................... | H02M 3/157 341/51 |
| 2007/0202839 A1* | 8/2007 | Abraham ............... | H04B 3/548 455/402 |
| 2008/0025450 A1* | 1/2008 | Alfano ............... | H02M 3/33523 375/362 |
| 2010/0214082 A1* | 8/2010 | Covaro .................... | H04B 3/54 370/212 |
| 2013/0077358 A1* | 3/2013 | Gaknoki ........... | H02M 3/33507 327/309 |
| 2013/0182781 A1* | 7/2013 | Matsutani ................ | H04B 3/54 375/257 |
| 2013/0258731 A1* | 10/2013 | Xu ......................... | H02M 1/08 363/78 |
| 2014/0097818 A1* | 4/2014 | Wiktor ................ | H02M 3/1584 323/283 |
| 2014/0313784 A1* | 10/2014 | Strzalkowski .... | H02M 3/33584 363/17 |
| 2015/0364996 A1* | 12/2015 | Mansri .................. | H02M 3/158 323/271 |

FOREIGN PATENT DOCUMENTS

| | | | |
|---|---|---|---|
| EP | 3101807 A1 | 12/2016 | ............. H03F 3/21 |
| EP | 3163550 A1 | 5/2017 | ............. G08C 19/02 |
| WO | 2015/061220 A2 | 4/2015 | ............. H05B 33/08 |
| WO | 2016/003090 A1 | 1/2016 | ............. G08C 19/02 |
| WO | 2018/086899 A1 | 5/2018 | ............ H02M 3/139 |

* cited by examiner

AMPLIFIER CIRCUIT AND METHOD FOR OPERATING AN AMPLIFIER CIRCUIT

CROSS-REFERENCE TO RELATED APPLICATIONS

This application is a U.S. National Stage Application of International Application No. PCT/EP2017/077453 filed Oct. 26, 2017, which designates the United States of America, and claims priority to EP Application No. 16198640.1 filed Nov. 14, 2016, the contents of which are hereby incorporated by reference in their entirety.

TECHNICAL FIELD

The present disclosure relates to amplifier circuits. Various embodiments may include method and/or systems for operating an amplifier circuit.

BACKGROUND

Fire detectors and other addressed notification appliances combined in a network, e.g. smoke detectors, signaling devices, alarm devices such as strobe lights and so-called sounders, input/output (I/O) devices, repeaters, terminals, floor indicators and the like—hereinafter referred to individually and collectively as field device or field devices for short—are typically operated via a detector line using a communication protocol, usually the so-called FDnet protocol, and supplied with electrical power via the detector line and within the scope of the communication protocol. The communication protocol provides for a high voltage swing. Such a detector line is usually electrically isolated from the rest of the fire alarm system. The trend of installing more and more field devices, such as addressed so-called loop sounders and strobe lights, is resulting in an increased power requirement on the detector lines of the network. The line driver is designed to supply the required current to the field devices. The increase in the installed power on the line requires more powerful line drivers. With the existing solution, the increased power demand causes increased power dissipation and also current limiting problems. Amplifier circuits and methods for the operation thereof are well known.

The older unpublished patent application 15 170 028.3 entitled "Verstärkerchaltung and Verfahren zum Betrieb einer Verstärkerschaltung" (Amplifier circuit and method for operating an amplifier circuit) describes an amplifier circuit and a method for the operation thereof, wherein the amplifier circuit comprises a DC/DC converter that is electrically isolated on both sides and acts as an amplifier, wherein an output signal of the amplifier circuit is fed back to an input-side summation point by means of a feedback path and wherein the DC/DC converter is connected between the summation point and an output-side output filter. The redundant circuit sections in the case of a separate design of the voltage supply section and the amplification section, namely the pulse width modulator, the first and second switching stage and the output filter of the DC/DC converter, are used to amplify the input signal and directly generate the output signal.

US 2014/0313784 A1 describes an amplifier circuit which comprises a DC/DC converter and two electrically isolated switching stages.

Switches of the two switching stages can be controlled by means of a logic block comprising a PWM modulator. The disadvantages of known amplifier circuits include unfavorable power losses and amplification ratios that are not always precise.

SUMMARY

The teachings of the present disclosure include an amplifier circuit that is improved in comparison to the known systems and a method for the operation thereof. For example, some embodiments include an amplifier circuit (2a) having a DC/DC converter (1) integrated in the amplifier circuit (2a) as a power stage, wherein the amplifier circuit (2a) acts as a line driver in a transmission line between a central station and field devices (4) connected to the transmission line, wherein the integrated DC/DC converter (1) acts as a DC/pulse converter (1), wherein the DC/pulse converter (1) comprises two electrically isolated switching stages (11, 13), wherein the DC/pulse converter (1) is preceded by a logic block (27), and wherein, by means of the logic block (27), control signals for switches (27a, 27b) of the DC/pulse converter (1) can be generated from a PWM signal and fed into the DC/pulse converter (1) in an electrically isolated manner by means of drivers (27c, 27d), characterized in that the amplifier circuit (2a) comprises a priority block (23) and a first controller (22) and a second controller (22a), the PWM signal can be generated using an output of the priority block (23), by means of the priority block (23), either an output signal of the first controller (22) or an output signal of the second controller (22a) can be forwarded, by means of the first controller (22), a first fault signal can be generated on the basis of a predefined or predefinable voltage limit value and of an output voltage fed back within the amplifier circuit (2a) via a feedback path (20) and by means of the second controller (22a), a second fault signal can be generated on the basis of a predefined or predefinable current limit value and of an output current fed back within the amplifier circuit (2a) via a feedback path (26), wherein the current limit value and the voltage limit value can be predefined by the central station at a first input (current set) and a second input (voltage set) respectively.

In some embodiments, the integrated DC/DC converter (1) acts as a DC/pulse converter (1), the DC/pulse converter (1) comprises two electrically isolated switching stages (11, 13) inductively coupled by means of a transformer (12), the first switching stage (11) and the second switching stage (13) each comprise a power stage (111, 113)—first power stage (111), second power stage (113), by means of the first power stage (111), a voltage transmittable via the transformer (12) and which is chopped according to a PWM signal that can be generated by means of the amplifier circuit (2a) can be generated from an input voltage fed to the first power stage (111) and by means of the second power stage (113), the chopped voltage transmitted by means of the transformer (12) can be composed in a phase-correct manner.

In some embodiments, the first power stage (111) comprises two switches (27a, 27b) and the second power stage (113) comprises two switches (131a, 131b) and control signals for the switches (27a, 27b, 131a, 131b) can be generated from a PWM signal by means of a logic block (27).

As another example, some embodiments include a method for operating an amplifier circuit (2a) as described above, wherein control signals for switches (27a, 27b) of the DC/pulse converter (1) are generated from a PWM signal by means of the logic block (27) and injected into the DC/pulse converter (1) in an electrically isolated manner by means of drivers (27c, 27d), wherein the PWM signal is generated using an output of a priority block (23) incorporated in the amplifier circuit (2a), wherein an output signal of a first or of a second controller (22, 22a) incorporated in the amplifier circuit (2a) is forwarded by means of the priority block (23), wherein, by means of the first controller (22), a first fault signal is generated on the basis of a predefined voltage limit value and of an output voltage fed back within the amplifier circuit (2a) via a feedback path (20) and wherein, by means of the second controller (22a), a second fault signal is generated on the basis of a predefined current limit value and of an output current fed back within the amplifier circuit (2a) via a feedback path (26).

In some embodiments, the integrated DC/DC converter (1) acts as a DC/pulse converter (1) and comprises two electrically isolated switching stages (11, 13) that are inductively coupled by means of a transformer (12), wherein the first switching stage (11) and the second switching stage (13) each comprise a power stage (111, 113)—first power stage (111), second power stage (113), wherein, by means of the first power stage (111), a voltage transmittable via the transformer (12) and which is chopped according to a PWM signal that can be generated by means of the amplifier circuit (2a) is generated from an input voltage fed to the first power stage (111) and wherein the chopped voltage transmitted by means of the transformer (12) is composed in a phase-correct manner by means of the second power stage (113).

In some embodiments, the first power stage (111) comprises two switches (27a, 27b) and the second power stage (113) comprises two switches (131a, 131b) and control signals for the switches (27a, 27b, 131a, 131b) are generated from a PWM signal by means of a logic block (27).

As another example, some embodiments include a device for controlling field devices (4) acting as fire alarm devices, comprising an amplifier circuit (2a) as described above.

BRIEF DESCRIPTION OF THE DRAWINGS

Exemplary embodiments are explained in greater detail with reference to the accompanying drawings. Mutually corresponding items or elements are provided with the same reference characters in all the figures, in which.

DETAILED DESCRIPTION

In some embodiments, an amplifier circuit comprises a DC/DC converter which is integrated as a power stage in the amplifier circuit. By means of the DC/DC converter and the integration thereof in the amplifier circuit, electrical isolation of the input-side supply voltage $V_{in}$ from the output voltage $V_{out}$ generated by means of the amplifier circuit is achieved in such a way that the desired output voltage $V_{out}$ and the desired output signal are produced directly and without a DC link voltage being generated, providing a simplified design of the first switching stage of the voltage converter.

In the case of known circuits, the first switching stage comprises input- and output-side inductive transformers and two inversely controlled bridges. For the circuit proposed here, such a power stage is replaced by a much simpler power stage. By means of the power stage, the input voltage $V_{in}$ is chopped in such a way that just the desired output voltage is produced, namely by means of a pulse-width-modulated (PWM) signal whose duty cycle (ON-time/period) is equal to the desired output voltage in proportion to the input voltage $V_{in}$ multiplied by the transformer ratio.

In some embodiments, the DC/DC converter integrated in the amplifier circuit acts as a DC/pulse converter and comprises two electrically isolated switching stages. By means of a logic block connected upstream of the DC/pulse converter, control signals for switches of the DC/pulse converter can be generated from a PWM signal and injected into the DC/pulse converter in an electrically isolated manner by means of drivers.

In some embodiments, there is a priority block as well as a first controller and a second controller and the above-mentioned PWM signal can be generated on the basis of a priority block output. For this purpose, either an output signal of the first controller or an output signal of the second controller can be forwarded by means of the priority block. By means of the first controller, a first fault signal can be generated on the basis of a predefined or predefinable voltage limit value and an output voltage fed back within the amplifier circuit via a feedback path. By means of the second controller, a second fault signal can be generated on the basis of a predefined or predefinable current limit value and an output current fed back within the amplifier circuit via a feedback path. In the form of the two controllers, the amplifier circuit comprises a separate control loop for current and voltage which control a primary-side actuator (first switching stage) in an electrically isolated manner. This actuator chops (PWM) the input voltage $V_{in}$ and feeds it via a controlled rectifier to a filter which filters out the switching frequency.

The description of particular embodiments herein is not to be understood as a waiver of the right to independent, objective protection for the combination of features of the various teachings to which they refer. In addition, it is to be assumed that such restriction in one embodiment is not required in the others. Each reference in the description to aspects of embodiments even without specific indication is consequently to be read explicitly as a description of optional features.

With the increase in output power necessitated by the connection of strobe lights, an analog (linear) solution is becoming increasingly difficult, inefficient, and more costly and space-consuming. The linear solution involves losing a certain amount of the power in the linear driver. Together with the losses of the upstream DC/DC converter, the power dissipation amounts to 30-40%. In the case of an output power of around 50 W, this is almost 20 W. Such a power dissipation can no longer be handled by a simple, inexpensive form of cooling. In the event of a fault, the entire output power must even be dissipated as power loss for a certain time, which creates major problems. A switched solution can generate the output voltage (field device voltage, detector voltage) highly efficiently, wherein, in the event of a fault, the energy is not consumed as power loss, but is not even drawn at all.

Assuming that a DC/DC converter is already being used for stabilization and electrical isolation of the DC input voltage of a linear amplifier, the teachings herein allow the converter and the amplifier to be combined to form a single switched stage. A circuit board containing an example circuit described herein may increase the efficiency of a detector line driver from 65% to almost 90%. In spite of the greater complexity, the circuit with an output current of 1.5 A is only slightly more expensive than the existing linear solution with 0.5 A output current. It has been possible to reduce the space requirement by some 30% compared to the existing solution. Because the current limiting is now lossless for the circuit proposed here, the behavior in fault situations is also greatly improved. The possibility of using different switching topologies means that the solution is readily power-scalable.

In the case of a method for operating such an amplifier circuit, the usual electrically isolated generation of the supply voltage of the amplifier and the amplifier itself are combined into one circuit. Features and details described in connection with the amplifier circuit and any embodiments self-evidently also apply in the context of a method and individual embodiments of such a method for operating an amplifier circuit and vice versa, so that reference is always made or can always be made reciprocally in respect of the disclosure concerning the individual aspects of the teachings herein.

For the description which follows, to avoid unnecessary repetitions, it shall be deemed that the method can also be further developed by means of individual or a plurality of method features relating to method steps carried out by the amplifier circuit and means incorporated therein and the amplifier circuit can be further developed accordingly by means of individual or a plurality of device features relating to means of carrying out method steps carried out as part of the method. In some embodiments, there is a device for controlling field devices of the type mentioned in the introduction operating as alarm devices, comprising an amplifier circuit as described here and in the following and/or an amplifier circuit having means for carrying out the operating method.

Figure 1:
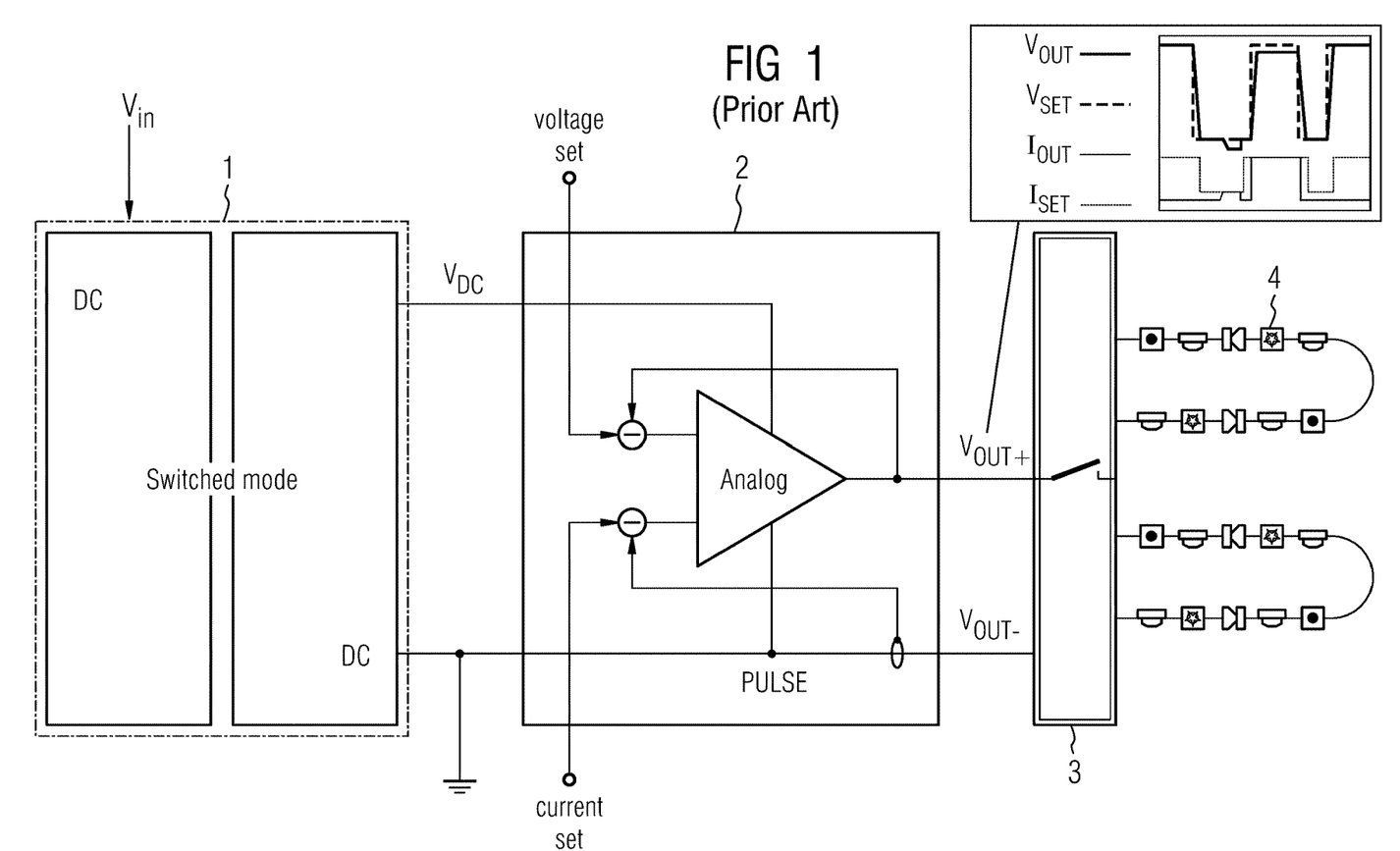
FIG. 1 shows a known amplifier circuit having a series-connected DC/DC converter for generating the supply voltage of the amplifier.

FIG. 1 shows a known amplifier circuit acting as a line driver. To generate the supply voltage of the amplifier circuit it comprises, on the input side, an electrically isolated DC/DC converter 1 and a downstream linear amplifier 2. Connected to the linear amplifier 2 is a multiplexer circuit 3 which forwards, in a switched manner, the output voltage $V_{out+}/V_{out-}$ generated by means of the linear amplifier 2 to individual branches of a network comprising loads in the form of field devices 4, in particular smoke detectors, signaling devices, alarm devices such as strobe lights and so-called sounders, input/output (I/O) devices and floor indicators. For example, individual branches of the network can be disconnected by means of the multiplexer circuit 3, e.g. branches having a short circuit due to a defective field device 4.

A line driver is basically designed in a known manner to ensure and/or improve the quality of the electrical signals to be transmitted over the respective transmission line (detector line). The amplifier circuit may be a line driver in a transmission line running between a central station (not shown) and the field devices 4. The central station generates the data transmitted over the transmission line for the connected field devices 4, e.g. for the control thereof, in particular for control which causes a respective field device 4 to output signals or to communicate fire alarms and status messages over the respective line and therefore in the field device network, which encodes a measured value of the field device 4 or the like. This data is output by the central station as setpoint values to the voltage set and current set inputs.

By means of the DC/DC converter 1, a constant output voltage (DC output voltage) $V_{DC}$ is generated from the input voltage $V_{in}$ in an electrically isolated manner. For the DC/DC converter, different topologies come into consideration depending on a required output power in each case, namely a so-called flyback topology or a so-called forward topology.

Communication with the field devices 4 takes place according to a predefined protocol, e.g. the FDnet protocol. Here a charging phase without communication and a communication phase follow one another in equidistant transmission cycles. During the charging phase, power is supplied to the connected field devices 4. During the communication phase, information for the field devices 4 is transmitted via the network.

The linear amplifier 2 is used to modulate the DC output voltage $V_{DC}$ of the DC/DC converter 1 that is supplied to the linear amplifier 2 on the input side and the linear amplifier 2 limits the current in the transmission line during a transmission cycle. The resulting modulated voltage (output voltage, $V_{out}$) allows communication with the field devices 4 during the communication phase, wherein the data can be transmitted bidirectionally. Even during the communication phase, the field devices 4 are supplied with electrical energy by means of the output voltage $V_{out}$ during the High level of the output voltage $V_{out}$.

During a charging phase, an upper limit value for the current applies and during the Low phase of the transmission cycle another limit value can be set, as shown in a schematically simplified manner at the top right-hand side of the diagram in FIG. 1. The limit values $V_{set}$ and $I_{set}$ for the limiting of the output voltage $V_{out}$ and of the current $I_{out}$ can be predefined via two inputs of the linear amplifier 2 (voltage set and current set respectively) and are predefined dynamically by means of these inputs during operation.

Figure 2:
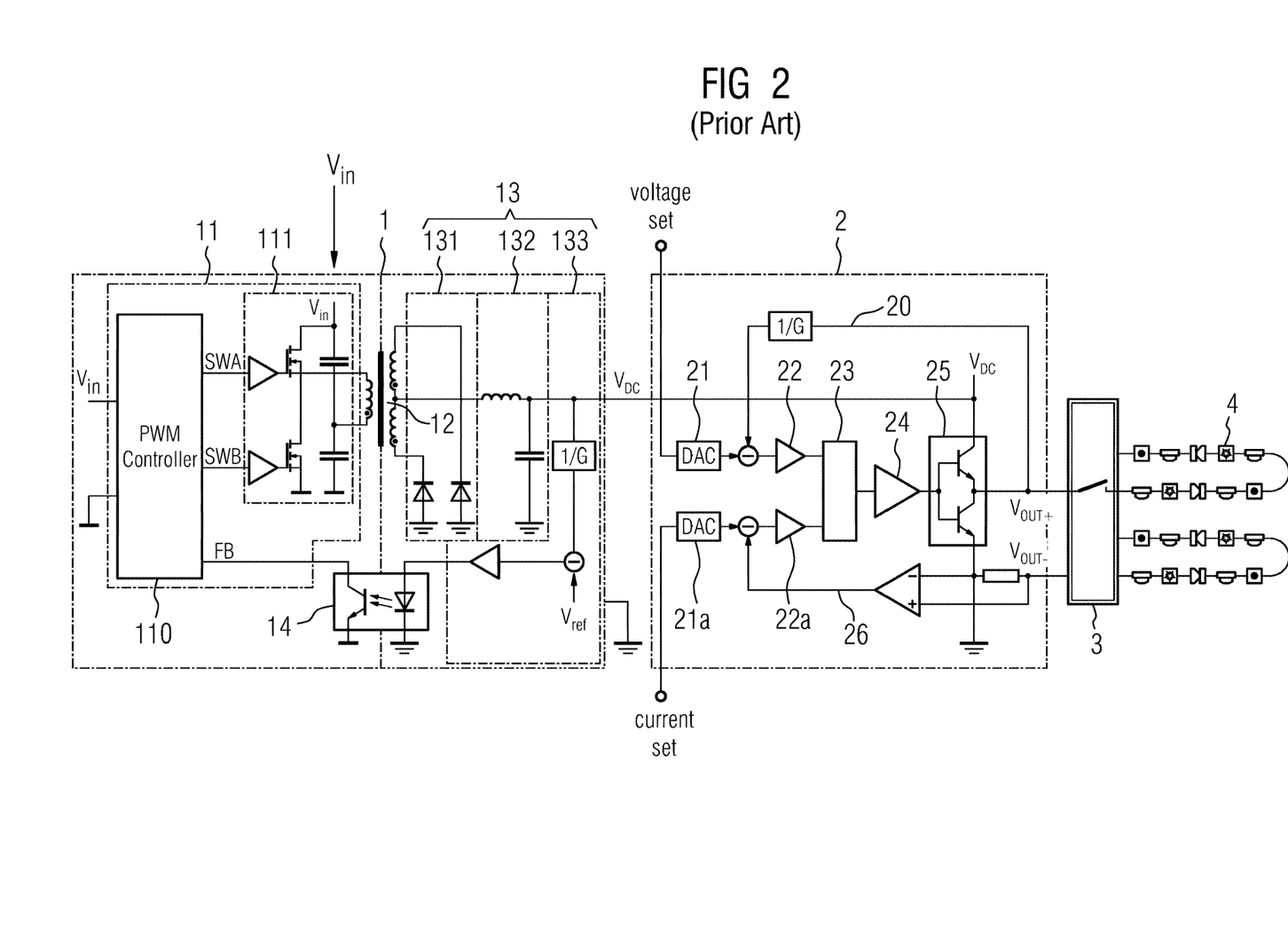
FIG. 2 shows further details of the circuit as shown in FIG. 1.

The diagram in FIG. 2 shows the line amplifier according to FIG. 1 with further details. The DC/DC converter 1 accordingly comprises a first switching stage 11 and a second switching stage 13. The two switching stages 11, 13 are electrically isolated from one another by way of inductive coupling by means of a transformer 12, in particular a power transformer, on the one hand and by means of a feedback path 133 having an associated optocoupler 14 on the other.

The first switching stage 11 comprises a pulse width modulator 110 and a power stage 111. In the design shown, a half bridge operates as a power stage 111. Other designs of a power stage 111 are likewise possible, e.g. all the known designs of forward or flyback converters in different versions such as push-pull or full bridge. The usually battery-buffered input signal $V_{in}$ to be amplified and transmitted is supplied in the first power stage 111.

The second switching stage 13 comprises a rectifier circuit 131 which rectifies the voltage chopped according to the PWM signal produced by the pulse width modulator 110 and transmitted via the transformer 12. In the design shown, a circuit comprising diodes acts as a rectifier circuit 131 (asynchronous rectification). Synchronous rectification is also possible, but not necessary.

A filter 132 (output filter), in particular a filter 132 acting as a low-pass filter in the form of an LC element, is used to filter the chopped and rectified voltage to obtain the output voltage $V_{DC}$.

The output voltage $V_{DC}$ is fed to the pulse width modulator 110 via the feedback path 133 and the optocoupler 14 for controlled stabilization of the output voltage $V_{DC}$.

The linear amplifier 2 modulates the DC output voltage $V_{DC}$ obtained from the DC/DC converter 1 according to the maximum voltage and maximum current values predefined via the voltage set and current set inputs. A first and a second D/A converter 21, 21*a* (digital/analog converter; DAC) are provided for this purpose.

The output voltage $V_{out+}$ fed back via a feedback path 20 with inverse system gain (1/G) is subtracted from the value at the output of the first D/A converter 21 resulting from the voltage limit value $V_{set}$ predefined via the voltage set input and the resulting signal is fed to a first controller 22. Similarly, the respective output current fed back via a feedback path 26 is subtracted from the value at the output of the second D/A converter 21*a* resulting from the current limit value $I_{set}$ predefined via the current set input and the resulting signal is fed to a second controller 22*a*.

The output signals of the two controllers 22, 22*a* are first fed to a priority block 23. On the basis of the priority block 23, one of the output signals of the controllers 22, 22*a* is fed to a preamplifier 24 at the output of the priority block 23. If an output current ($I_{out}$) exceeds the current limit value ($I_{set}$), the priority block 23 is used to prioritize the current limit value ($I_{set}$) over the voltage limit value ($V_{set}$). Depending on whether the voltage must be maintained or reduced due to an overcurrent, either voltage control (first controller 22) or current control (second controller 22*a*) operates. Up to the current limiting, the output voltage is maintained; if the maximum current is reached, it is reduced and the maximum current is maintained.

The preamplifier 24 is used to control a power stage 25 which generates the output voltage $V_{out+}$ as the actual output signal of the line amplifier. This is supplied to the field devices 4 via the multiplexer circuit 3.

Figure 3:
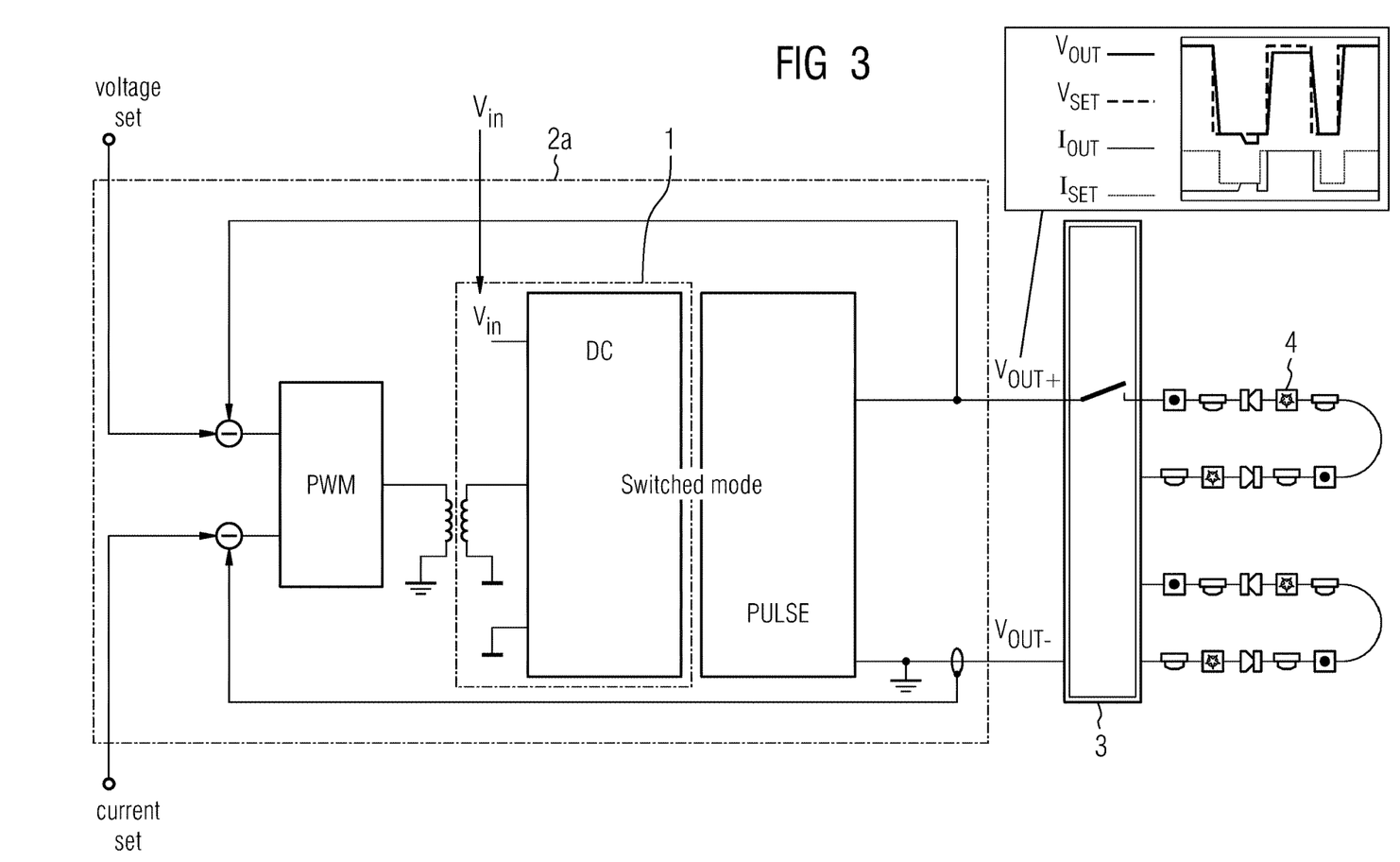
FIG. 3 shows an embodiment of an amplifier circuit incorporating teachings of the present disclosure.

FIG. 3 shows in the same form as FIG. 1 a schematically simplified representation of an example amplifier circuit 2*a* incorporating the teachings herein and acting as a line driver (switched mode line driver). It comprises—see also FIG. 1 and the associated description—a DC/DC converter 1 having two switching stages 11, 13 (FIG. 4) electrically isolated from one another which acts as an output stage in the amplifier circuit 2*a*. In contrast to the situation illustrated in FIG. 1 and FIG. 2, the DC/DC converter 1 is not followed by a linear amplifier 2. Instead, a modified DC/DC converter 1 is integrated in the amplifier circuit 2*a* where it replaces the analog power stage 25.

Unlike the DC/DC converter 1 in FIG. 1, FIG. 2, the modified DC/DC converter 1 does not generate a DC output voltage $V_{DC}$, but instead produces voltage pulses and will therefore be referred to hereinafter as a DC/pulse converter 1 for differentiation from the embodiment according to FIG. 1, FIG. 2. Due to the absence of the DC/DC converter, the PWM signal is now no longer generated by means of a separate pulse width modulator 110 (FIG. 2), but directly by means of the line driver 2*a*, wherein the new PWM signal corresponds to the desired output voltage, whereas in the situation according to FIG. 2 the PWM signal generated there by means of the separate pulse width modulator 110 corresponds to a fixed DC voltage. The PWM signal must be transmitted across the electrical isolation—implemented by means of the DC/pulse converter 1—between the input- and output-side of the line amplifier. This takes place by means of a transformer or a semiconductor circuit (semiconductor isolator/driver). The number of power stages is therefore reduced by one power stage compared to the circuit shown in FIG. 2. This results in a cost saving and a reduced space requirement.

The DC/pulse converter 1 can be implemented using any kind of forward topology and synchronous rectification. Synchronous rectification is necessary for feedback of electrical energy to the input voltage $V_{in}$ because power is no longer consumed within the circuit, as is the case with known linear amplifiers.

Figure 4:
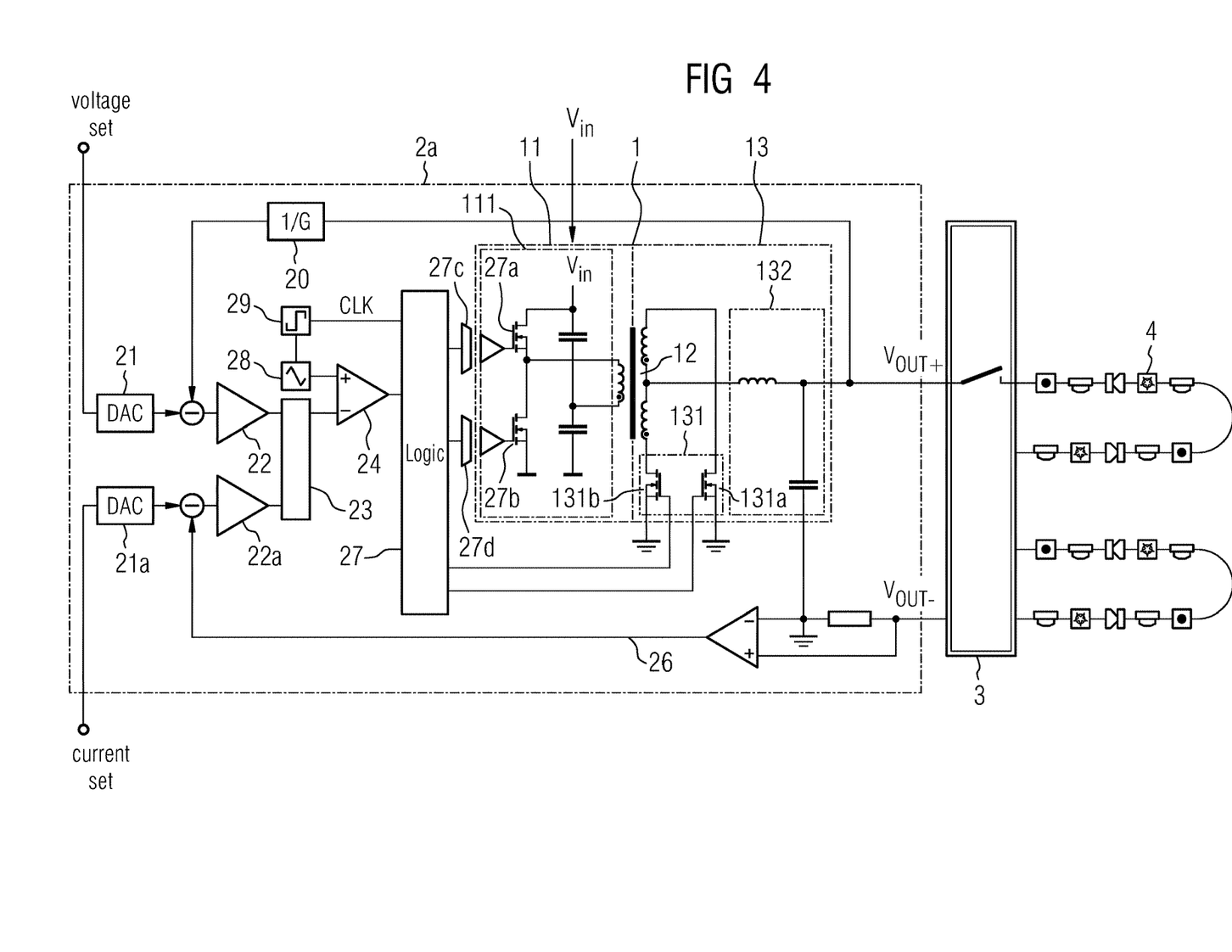
FIG. 4 shows details of the circuit according to FIG. 3.

The diagram in FIG. 4 shows the line driver 2*a* from FIG. 3 and the DC/pulse converter 1 integrated therein with additional details. Exactly as in the embodiment shown in FIG. 2, the line driver 2*a* according to FIG. 4 also comprises two D/A converters 21, 21*a* for predefining limit values (voltage set, current set) for the output voltage and the output current. Exactly as in the embodiment according to FIG. 2, the output voltage $V_{out+}$ fed back via a feedback path 20 with inverse system gain (1/G) is subtracted from the value at the output of the first D/A converter 21 resulting from the predefined voltage limit value (voltage set) and the resulting signal (first fault signal) is fed to a first controller 22.

Similarly, likewise exactly as in the embodiment according to FIG. 2, the respective output current fed back via a feedback path 26 is subtracted from the value at the output of the second D/A converter 21 resulting from the current limit value (current set) and the resulting signal (second fault signal) is fed to a second controller 22*a*. One of the output signals of the two controllers 22, 22*a* is fed to a pulse width modulator 24 depending on processing by a priority block 23 as in the embodiment according to FIG. 2. In the embodiment shown, a comparator acts as a pulse width modulator 24 and generates a PWM signal based on comparison of the fault signal forwarded by the priority block 23 with a triangular signal. The triangular signal is generated by means of a triangular signal generator 28 on the basis of a clock signal generated by a clock generator 29.

The PWM signal is forwarded according to the respective switching topology of the converter 1 and the first and second switching stage 11, 13 thereof. Switching topology is to be understood as meaning the design of the transformer 12 together with switches 27*a*, 27*b*, 131*a*, 131*b* contained in the converter 1. A DC/pulse converter 1 can be implemented using different control arrangements and different transformer designs. The number of switches 27*a*, 27*b*, 131*a*, 131*b* used and the way in which the control of these switches 27*a*, 27*b*, 131*a*, 131*b* is generated from the PWM signal can vary and is mainly dependent on the output power. In the embodiment according to FIG. 4, the first switching stage 11 comprises a first power stage 111 and the second switching stage 13 a second power stage 131 and the PWM signal is forwarded by means of a logic block 27. The power stages 111, 131 are implemented as half-bridge forward converters with synchronous rectification.

The PWM signal is generated by means of the block 24 by comparison of the fault signal (output of block 23) with the triangular signal from the triangular signal generator 28. The logic block 27 decodes the PWM signal to generate the topology-specific switching pattern for the individual switches 27*a*, 27*b*, 131*a* and 131*b*. The control signal for the switches 27*a*, 27*b* is fed from the logic block 27 into the converter 1, namely initially into the first power stage 111 thereof, in an electrically isolated manner by means of two drivers 27*c*, 27*d*. Here the input voltage is chopped according to the switching pattern decoded from the PWM signal and is fed to the primary winding of the transformer 12. The turns ratio of the transformer 12 is designed such that the voltage at the output can be set, depending on the mark/space ratio of the PWM signal, to the desired value which is predefined by the central station at the voltage set input and amplified with the system gain G by the control loop 20, 21, 22 incorporating the first controller 22 (first control loop 20, 21, 22).

The control loop 26, 21a, 22a incorporating the second controller 22a (second control loop 26, 21a, 22a) reduces the output voltage $V_{out}$ via the priority block 23 if the output current threatens to exceed the value set at current set. Electrically isolated transmission to the second power stage 131 takes place by means of the transformer 12. Here the chopped signal is rectified and composed by means of the two electronic switches 131a, 131b comprised by the second power stage 131, in particular electronic switches in the form of MOSFETs. The two electronic switches 131a, 131b allow (in contrast to the DC/DC converter 1 in FIG. 1 where this is unnecessary) a transmission of power from $V_{in}$ to $V_{out}$ or alternatively from $V_{out}$ to $V_{in}$ in the event that the capacitance of the transmission line has to be discharged during a negative-going edge. The signal rectified (second power stage 131) after chopping (first power stage 111) is filtered by means of a filter 132 (output filter), in particular a filter 132 acting as a low-pass filter in the form of an LC element, and at the output of the converter 1 and therefore at the output of the line amplifier there is produced overall, as an output voltage $V_{out}$, a pulsed voltage for supplying power to the field devices 4.

Figure 5:
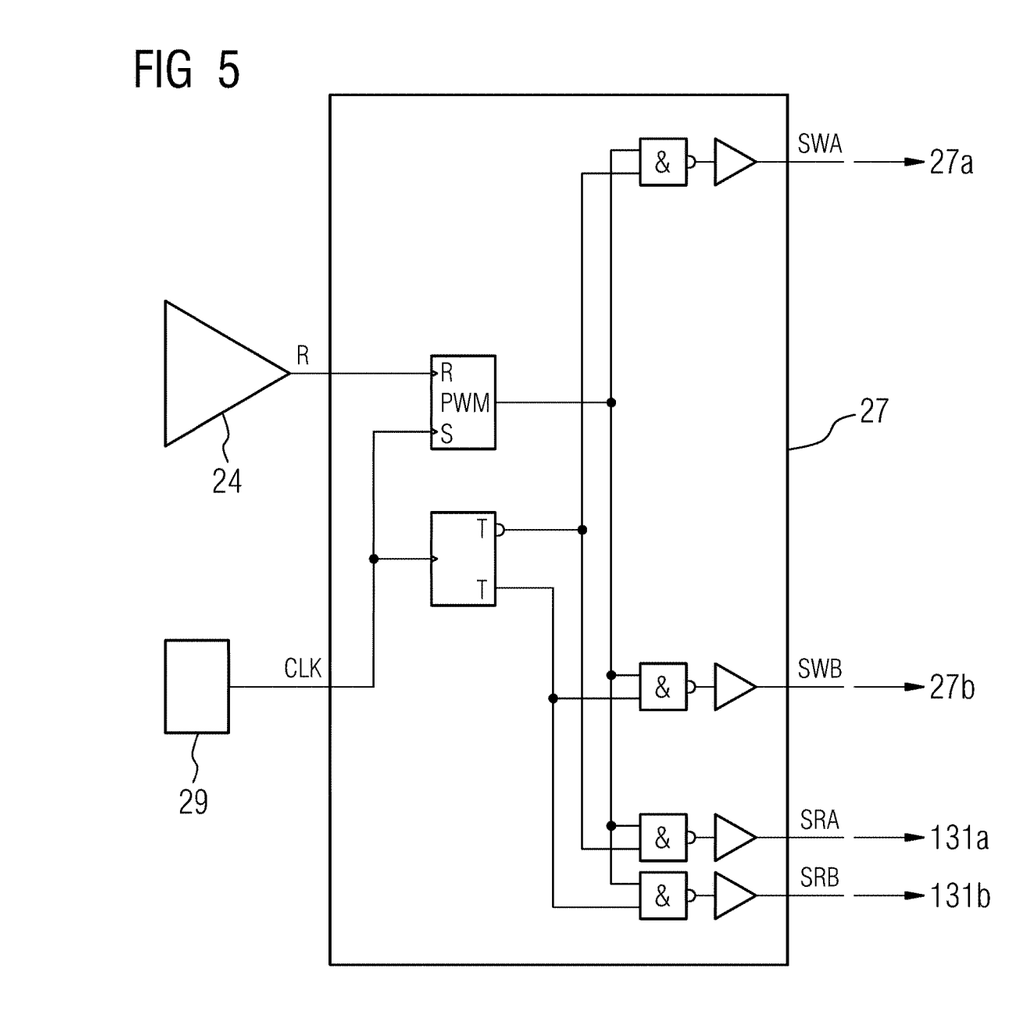
FIG. 5 shows details for the operation of a logic block incorporated in the circuit according to FIG. 3, FIG. 4, FIG. 6 symbolically illustrates the operation of the logic block according to FIG. 5.
Figure 6:
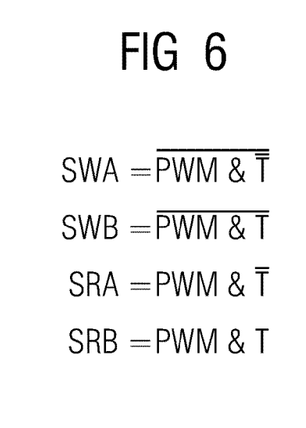
Figure 7:
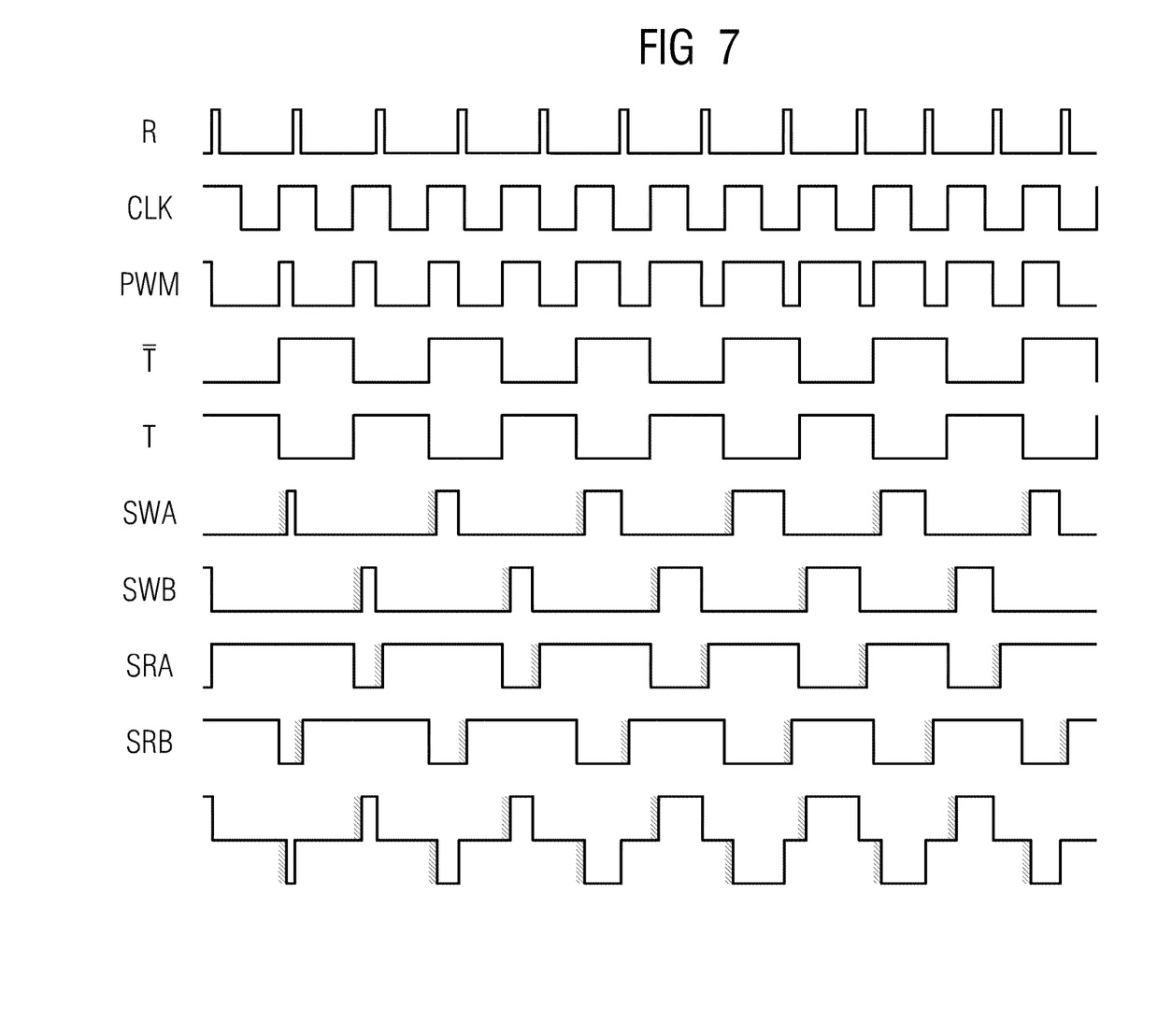
FIG. 7 shows a waveform over time of individual basic signals during operation of an amplifier circuit incorporating teachings of the present disclosure.

The diagram in FIG. 5 illustrates the function of the logic block 27. The output of the pulse width modulator 24 goes to the resetting input of an RS element in the logic block 27 (the clock generator 29 is connected to the setting input) and the output of the RS element is further processed as a PWM signal (PWM) by means of following AND gates to generate control signals SWA, SWB for controlling the drivers 27c, 27d and the following switches 27a, 27b of the first power stage 111 and to generate control signals SRA, SRB for controlling the electronic switches 131a, 131b of the second power stage 131. FIG. 6 shows the pulse diagram for the functionality of the logic block 27 and FIG. 7 shows a waveform of individual important signals, wherein the signal shown at the very bottom in FIG. 7 represents the voltage across the primary winding (on the side of the first power stage 111) of the transformer 12.

In comparison with the circuit of the older unpublished European patent application cited in the introduction, entitled "Verstärkerschaltung and Verfahren zum Betrieb einer Verstärkerschaltung" (Amplifier circuit and method for operating an amplifier circuit), a circuit is produced which makes it possible to dispense with one of the half-bridges showed in the older application (denoted there by the reference characters 60, 62 in the diagram in FIG. 4). The above-mentioned older application contains essential explanations relating to individual basic functions of the circuit sections of the amplifier circuit proposed in this application and shall consequently be hereby deemed to be incorporated in their entirety in the description presented here.

Although the teachings herein have been illustrated and described in detail by the exemplary embodiment, the scope thereof is not limited by the example(s) disclosed and other variations will be apparent to persons skilled in the art without departing from the scope of the teachings.

LIST OF REFERENCE CHARACTERS

1 DC/DC converter, converter, DC/pulse converter
2 linear amplifier
2a amplifier circuit
3 multiplexer circuit
4 field device
11 first switching stage
12 transformer
13 second switching stage
14 optocoupler
20 feedback path
21 D/A converter
21a D/A converter
22 controller
22a controller
23 priority block
24 preamplifier/pulse width modulator
25 power stage
26 feedback path
27 logic block
27a, b switch
27c, d driver
28 triangular signal generator
29 clock generator
110 pulse width modulator
111 first power stage
131 second power stage
131a, b electronic switch
132 filter
133 feedback path

What is claimed is:

1. An amplifier circuit acting as a line driver in a transmission line between a central station and field devices connected to the transmission line,
    the amplifier circuit comprising:
    a DC/DC converter comprising a DC/pulse converter with two electrically isolated switching stages;
    a logic block upstream of the DC/DC converter;
    wherein, the logic block generates control signals for switches of both electrically isolated switching stages from a PWM signal;
    wherein the control signals are fed into the two electrically isolated switching stages by drivers;
    a priority block generating the PWM signal by forwarding at least one of an output signal of a first controller or an output signal of a second controller to the logic block;
    the first controller generating a first fault signal based on a predefined or predefinable voltage limit value and an output voltage fed back within the amplifier circuit via a feedback path and sending the first fault signal to the priority block; and
    the second controller generating a second fault signal based on a predefined or predefinable current limit value and
    an output current fed back within the amplifier circuit via a feedback path and sending the second fault signal to the priority block; and
    the central station defining the current limit value and the voltage limit value at a first input (current set) and a second input (voltage set) respectively.

2. The amplifier circuit as claimed in claim 1, wherein: the integrated DC/DC converter acts as the DC/pulse converter;
    comprising two electrically isolated switching stages inductively coupled by means of a transformer;
    the first switching stage and the second switching stage each comprise a respective power stage;
    wherein, by means of the first power stage, a voltage transmittable via the transformer and chopped according to the PWM signal generated by means of the amplifier circuit can be generated from an input voltage fed to the first power stage; and wherein, by means of the second power stage, the chopped voltage transmitted by means of the transformer can be composed in a phase-correct manner.

3. The amplifier circuit as claimed in claim 2, wherein: the first power stage comprises two switches; the second power stage comprises two switches; and control signals for the four switches can be generated from the PWM signal by means the logic block.

4. A method for operating the amplifier circuit as claimed in claim 1, the method comprising:
generating control signals for switches of the DC/pulse converter using the PWM signal by means of the logic block;
injecting the control signal into the DC/pulse converter in an electrically isolated manner using drivers;
wherein the PWM signal is generated using an output the priority block incorporated in the amplifier circuit;
forwarding an output signal the first or the second controller incorporated in the amplifier circuit using the priority block;
generating, using the first controller, the first fault signal based on the predefined voltage limit value and the output voltage fed back within the amplifier circuit via the feedback path; and
generating, by means of the second controller, the second fault signal based on the predefined current limit value and the output current fed back within the amplifier circuit via the feedback path.

5. The method as claimed in claim 4, wherein: the integrated DC/DC converter acts as the DC/pulse converter comprising two electrically isolated switching stages inductively coupled by means of a transformer;
the first switching stage and the second switching stage each comprise a respective power stage;
by means of the first power stage, a voltage transmittable via the transformer and chopped according to the PWM signal that can be generated by means of the amplifier circuit is generated from an input voltage fed to the first power stage; and
the chopped voltage transmitted by means of the transformer is composed in a phase-correct manner by means of the second power stage.

6. The method as claimed in claim 5, wherein: the first power stage comprises two switches; the second power stage comprises two switches; and control signals for the four switches are generated from the PWM signal by means the logic block.

7. A device for controlling field devices, the device comprising: an amplifier circuit acting as a line driver in a transmission line between a central station and field devices connected to the transmission line, the amplifier circuit comprising:
a DC/DC converter comprising a DC/pulse converter with two electrically isolated switching stages;
a logic block upstream of the DC/DC converter;
wherein, the logic block generates control signals for switches of both electrically isolated switching stages from a PWM signal;
wherein the control signals are fed into the two electrically isolated switching stages by drivers;
a priority block generating the PWM signal by forwarding at least one of an output signal of a first controller or an output signal of a second controller to the logic block;
the first controller generating a first fault signal based on a predefined or predefinable voltage limit value and
an output voltage fed back within the amplifier circuit via a feedback path and sending the first fault signal to the priority block; and
the second controller generating a second fault signal based on a predefined or predefinable current limit value and
an output current fed back within the amplifier circuit via a feedback path and sending the second fault signal to the priority block; and
the central station defining the current limit value and the voltage limit value at a first input (current set) and a second input (voltage set) respectively.

* * * * *